(12) United States Patent
Ishebabi (10) Patent No.: US 8,364,946 B2
(45) Date of Patent: Jan. 29, 2013

(54) RECONFIGURABLE COMPUTING SYSTEM AND METHOD OF DEVELOPING APPLICATION FOR DEPLOYMENT ON THE SAME

(76) Inventor: Harold Ishebabi, Vancouver (CA)

( * ) Notice: Subject to any disclaimer, the term of this patent is extended or adjusted under 35 U.S.C. 154(b) by 348 days.

(21) Appl. No.: 12/729,131

(22) Filed: Mar. 22, 2010

(65) Prior Publication Data

US 2011/0231644 A1 Sep. 22, 2011

(51) Int. Cl.
*G06F 9/00* (2006.01)
*G06F 9/24* (2006.01)
*G06F 9/45* (2006.01)

(52) U.S. Cl. ........ 713/100; 717/132; 717/137; 717/140; 717/149

(58) Field of Classification Search .................. 713/100; 717/132, 137, 140, 149
See application file for complete search history.

(56) References Cited

U.S. PATENT DOCUMENTS

| | | | |
|---|---|---|---|
| 4,467,409 A | 8/1984 | Potash et al. | |
| 4,718,057 A | 1/1988 | Venkitakrishnan et al. | |
| 4,823,295 A | 4/1989 | Mader | |
| 5,068,823 A | 11/1991 | Robinson | |
| 5,684,980 A | 11/1997 | Casselman | |
| 5,946,219 A | 8/1999 | Mason et al. | |
| 6,021,423 A | 2/2000 | Nag et al. | |
| 6,077,315 A * | 6/2000 | Greenbaum et al. | 717/157 |
| 6,226,776 B1 | 5/2001 | Panchul et al. | |
| 6,557,156 B1 * | 4/2003 | Guccione | 716/117 |
| 7,171,548 B2 | 1/2007 | Smith et al. | |
| 7,188,192 B2 | 3/2007 | Mirsky et al. | |
| 7,343,594 B1 | 3/2008 | Metzgen | |
| 7,346,644 B1 | 3/2008 | Langhammer et al. | |
| 7,571,395 B1 | 8/2009 | Seng et al. | |
| 7,592,835 B2 | 9/2009 | Agarwal et al. | |
| 8,155,113 B1 * | 4/2012 | Agarwal | 370/386 |
| 2004/0088685 A1 * | 5/2004 | Poznanovic et al. | 717/140 |
| 2005/0283768 A1 * | 12/2005 | Ozone | 717/144 |
| 2006/0242385 A1 * | 10/2006 | Murakami et al. | 712/200 |

FOREIGN PATENT DOCUMENTS

WO PCT/CA2011/50132 3/2011

OTHER PUBLICATIONS

Gokhale, Maya, et al., Stream-Oriented FPGA Computing in the Streams-C High Level Language, Proceedings of the 2000 IEEE Symposium on Field-Programmable Custom Computing Machines (FCCM 2000), IEEE, Napa Valley, CA Apr. 17, 2000.

* cited by examiner

*Primary Examiner* — Vincent Tran (57) ABSTRACT

A method of developing an application for deployment on a computing system. The computing system includes a processor and a reconfigurable logic in communication with the processor for configuration thereby. The method includes programming the processor with hardware-neutral instructions in a high-level software programming language. The instructions are representative of an application configured to execute at least partially on the reconfigurable logic. The method further includes instantiating elements from a library of elements compatible with the high-level programming language; and constructing programmatically a generic data graph representative of the application to be mapped at least partially onto the reconfigurable logic. The generic data graph is expressed as streams of records flowing between operators. A computing system is also disclosed. By presenting an instruction level streaming data processing model that expresses an application as operators and data flows, the invention provide several advantages such as design portability.

17 Claims, 4 Drawing Sheets

RECONFIGURABLE COMPUTING SYSTEM AND METHOD OF DEVELOPING APPLICATION FOR DEPLOYMENT ON THE SAME

1. TECHNICAL FIELD

The present invention relates generally to configuring digital circuits, especially computationally intensive digital circuitry. More particularly, the present invention relates to application development on reconfigurable logic resources such as field-programmable gate arrays (FPGAs) employing an instruction level streaming (ILS) data processing model in a high-level programming language.

2. BACKGROUND OF THE INVENTION

In the computing industry, unsustainable power and thermal overheads have saturated achievable clock frequencies in modern processors, limiting the ability to rely on instruction-level parallelism and higher clock frequencies to achieve performance growth. The continuing quest for higher performance has started a trend focusing on thread- and task-level parallelism, leading to the emergence of homogeneous and heterogeneous multi-/many-core computing.

Heterogeneous computing focuses on the deployment of multiple types of processing elements within a single workflow, and allowing each processing element to perform the operations to which it is best suited within a given application. A processing element could be a general-purpose processor (GPP), a special-purpose processor (i.e. digital signal processor (DSP) or graphics processing unit (GPU)), a co-processor, or custom acceleration logic (application-specific integrated circuit (ASIC) or field-programmable gate array (FPGA)), for example.

One area of interest within the heterogeneous computing community is the use of reconfigurable logic processing elements such as FPGAs as a co-processor or accelerator to a conventional host processor such as a GPP. By implementing kernels within an application that are responsible for the majority of the run-time directly in FPGA hardware, the performance of the entire application may be significantly increased. One barrier to the use of FPGAs to boost performance, however, is the requirement for hardware design, a task ill-equipped for software engineers who often lack hardware knowledge.

One prior art approach to simplify the design process and raise design abstraction from hardware description language is the use of Matlab-to RTL and Simulink-to-RTL Flows. When simple graphical designs are mapped to FPGA proto-pying or evaluation boards which are fully integrated in the flow, the designers do not need FPGA knowledge. Examples include the integration of Xilink ML-boards in Xilink System Generator tool. A disadvantage of this flow however is that designers do need FPGA knowledge when targeting non-integrated FPGA platforms, or when complex designs are being developed. These two situations are typically encountered in real-world projects. Additionally, implemented designs are not portable to other platforms.

An alternative prior art approach is to employ C-to-RTL flows to compile high-level programming languages such as C into register transfer level (RTL) description, followed by FPGA synthesis. This prior art approach suffers from the need for time-consuming FPGA synthesis. Further, the resulting implementations are typically not portable because of necessary integration work.

Accordingly, there is a need for an environment for the development of an application, executable in a reconfigurable logic based heterogeneous computing system that supports an all-software development flow, design portability and eliminates traditional time-consuming synthesis.

3. SUMMARY OF THE INVENTION

Certain features, aspects and examples disclosed herein are directed to a method of developing an application for deployment on a computing system, such as may be applied on a software-defined radio. Certain features, aspects and examples are directed to a computing system for deployment of the aforementioned method. Additional features, aspects and examples are discussed in more detail herein.

In accordance with a first aspect, a method of developing an application for deployment on a computing system is disclosed. The computing system includes a processor and a reconfigurable logic in communication with the processor for configuration thereby. The method includes programming the processor with hardware-neutral instructions in a high-level software programming language, the instructions representative of an application configured to execute at least partially on the reconfigurable logic; instantiating elements from a library of elements compatible with the high-level programming language; and constructing programmatically a generic data graph representative of the application to be mapped at least partially onto the reconfigurable logic. The generic data graph is expressed as streams of records flowing between operators.

Embodiments of the method of the present invention may include one or more of the following features. In some embodiments, the method of developing an application for deployment on a computing system further includes mapping the generic data graph to the reconfigurable logic. In certain embodiments, the reconfigurable logic includes reconfigurable logic blocks arranged in an array, and the method further includes selecting a configuration file to load to the reconfigurable logic array based on resources required to implement the generic data path, thereby configuring the reconfigurable logic array; and selecting an operation for each of the reconfigurable logic blocks and determining routing information, thereby configuring the reconfigurable logic blocks.

According to some embodiments, the generic data graph is constructed programmatically with operator overloading. In other embodiments, the generic data graph is constructed programmatically with library functions.

In some embodiments, the method further includes generating a machine-executable code in response to the programmed instructions and the instantiated library elements.

In certain embodiments, the application is configured to execute partially on the reconfigurable logic and partially on the processor. In other embodiments, the application is configured to execute on the reconfigurable logic.

In accordance with an additional aspect, a computing system is disclosed. The computing system includes a processor and a reconfigurable logic in communication with the processor for configuration thereby. The computing system further includes machine-executable instructions representative of an application. The application is configured to execute at least partially on the reconfigurable logic. At least the portion of the application configured to execute on the reconfigurable logic is represented by a generic data graph constructed from a high-level programming language. The generic data graph is expressed as streams of records flowing between operators. The processor configures the reconfigurable logic based at least in part on one or more of the machine-executable instructions and the generic data graph.

Embodiments of the computing system of the present invention may include one or more of the following features.

In accordance to certain embodiments, once the reconfigurable logic is configured by the processor, the application configured to execute at least partially on the reconfigurable logic is executed independently of the processor. In some embodiments, the application configured to execute at least partially on the reconfigurable logic is executed independent of instruction scheduling. In some embodiments, the application configured to execute at least partially on the reconfigurable logic is executed without explicit data movement instructions.

In some embodiments, the reconfigurable logic includes reconfigurable logic blocks arranged in an array. The processor configures the reconfigurable logic array by selecting a configuration file to load to the reconfigurable logic array based on resources required to implement the generic data path, thereby configuring the reconfigurable logic array; and selecting an operation for each of the reconfigurable logic blocks and determining routing information, thereby configuring the reconfigurable logic blocks.

In accordance with certain embodiments, the generic data graph is constructed programmatically with operator overloading. In other embodiments, the generic data graph is constructed programmatically with library functions.

In some embodiments, the application is configured to execute partially on the reconfigurable logic and partially on the processor. In other embodiments, the application is configured to execute on the reconfigurable logic.

Further advantages of the invention will become apparent when considering the drawings in conjunction with the detailed description.

4. BRIEF DESCRIPTION OF THE DRAWINGS

Similar reference numerals refer to corresponding parts throughout the several views of the drawings.

5. DETAILED DESCRIPTION OF THE INVENTION

Figure 1:
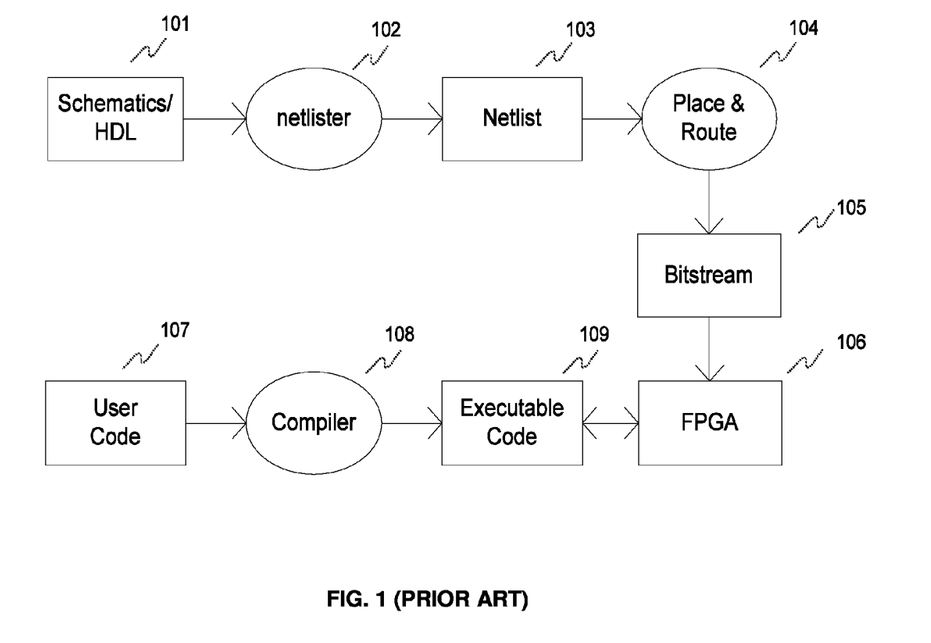
FIG. 1 illustrates prior art hardware and software design flows for a heterogeneous computing system comprising an FPGA.

Design of a circuit implemented in an FPGA using a reconfigurable logic coprocessor currently requires a combination of two distinct design paths, as shown in prior art FIG. 1. The first and perhaps most significant portion of the effort involves circuit design using traditional CAD tools. The design path for these CAD tools typically comprises entering a design 101 using a schematic editor or hardware description language (HDL), using a netlister 102 to generate a netlist 103 for the design, importing this netlist into an FPGA placement and routing tool 104, which finally generates a bitstream file 105 of configuration data which is used to configure FPGA 106.

Once the configuration data has been produced, the next task is to provide software to interface the host processor to the FPGA. The user enters user code 107 describing the user interface instructions, which is then compiled using compiler 108 to produce executable code 109. The instructions in executable code 109 are then used by the processor to communicate with the configured FPGA 106. It is also known to use executable code 109 to control the configuration of FPGA 106 with bitstream file 105. This series of tasks is usually completely decoupled from the task of designing the circuit and hence can be difficult, time-consuming and error-prone. Additionally, where traditional hardware design tools provide support almost exclusively for static design, they only support limited run-time reconfiguration for small well-defined portions of the FPGA. Accordingly, there is an outstanding need to integrate the aforementioned software and hardware flows to boost the productivity of design flows, and to provide full support for run-time FPGA reconfiguration.

As mentioned, a circuit implemented on reconfigurable logic (e.g. FPGA) is typically designed using hardware description languages, such as VHDL and Verilog. To a software developer accustomed to programming models that rely on high level languages, the need for FPGA knowledge further prevents the wide deployment of FPGA-based heterogeneous computing systems. Attempts have been made to raise the level of FPGA design abstraction. The results however have been unsatisfactory, as summarized above in the background of the invention in connection with prior art design flows.

However, an embodiment according to the present invention provides application programmers, engineers, and designers with the ability to use a high-level programming language, such as BASIC, C, C++, COBOL, Fortran, JAVA, LISP, Pascal, or any other suitable high-level programming language, to configure reconfigurable logic resources such as an FPGA. More specifically, in an embodiment of the invention, an application code developed in a high-level programming language may reside in a host processor such as a GPP, which configures the FPGAs directly. Configuration, reconfiguration and host run-time operations may all be supported in a single piece of code, thereby raising the abstraction level from traditional hardware description language (HDL) based design, and allowing for application programmers to configure reconfigurable logic resources without the need for understanding or using such traditional HDL based approaches.

Instruction Level Streaming

In one embodiment, one or more goals of the present invention may be accomplished by a data processing model that employs instruction level streaming (ILS), allowing applications to more easily exploit data level parallelism on reconfigurable logic resources such as FPGAs. In prior art FPGA-based heterogeneous computing systems, an FPGA has been used as a co-processor to a host processor to accelerate key kernels. However, in an embodiment of the present invention, traditional overheads associated with instruction scheduling and explicit data movement instructions may be desirably avoided by taking streaming to the instruction level, or operator level. Streaming refers to the manner of processing data where samples are taken from one execution entity to another for processing in a continuous stream-like manner. The terms data and samples are used interchangeably herein. In one embodiment, by expressing computationally-intensive kernels of an application programmatically as a generic data graph with streams of records flowing between operators, once the generic graph is mapped into hardware constructs on the FPGA, the FPGA may desirably operate in essence like a static circuit and execute the kernel independently from the host processor. In such an embodiment, the programmatic construction of a generic data graph may be implemented with overloaded operators or application program interface (API) libraries, the details of which are described further below.

The ILS data processing model of embodiments of the invention may be applicable for application developments and deployments in heterogeneous computing systems that include one or more host processors and FPGAs, or independently on processors with architectures that expose data-level parallelism. To employ the ILS model to process signals, an application developer may use a high-level programming language and libraries that contain predefined functions, such as API functions, to develop a computer readable code that issue instructions directly, or indirectly through an intermediate controller, for interfacing with and configuring one or more FPGAs. For example, an addition instruction in a programming language may be programmatically mapped to one of multiple configurable logic blocks in an FPGA that implements an addition operation in hardware. This desirably avoids having to take into account reconfigurable hardware when writing software programs. Thus, any software program may be translated into a configuration of a hardware reconfigurable logic resource without the need to resort to writing some portions of the software in a hardware language such as an HDL. The ability to design a logic circuit to be implemented on an FPGA in a high level programming language in an embodiment of the present invention also advantageously integrates traditionally separate hardware and software design flows, such as illustrated in prior art FIG. 1, thereby simplifying the design process. Through mechanisms detailed below to aid in the development of an application code for running on processors to construct arbitrary data paths on reconfigurable logic resources such as FPGAs, FPGA application development may desirably be in effect as easy as modeling DSP chains in a modeling environment such as Matlab™. Accordingly, through embodiments of the present invention, application-development flows on heterogeneous systems may be advantageously improved, enabling developers to move from application development to deployment quickly and efficiently.

Method

Figure 2:
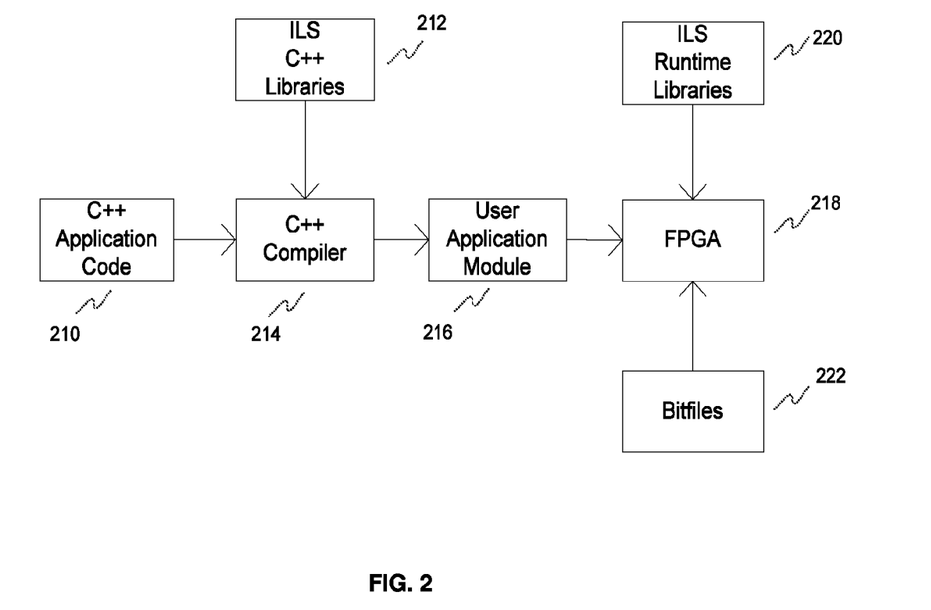
FIG. 2 illustrates a flow diagram of an exemplary method of developing an application for deployment on a heterogeneous computing system comprising an FPGA according to an embodiment of the present invention.
Figure 3:
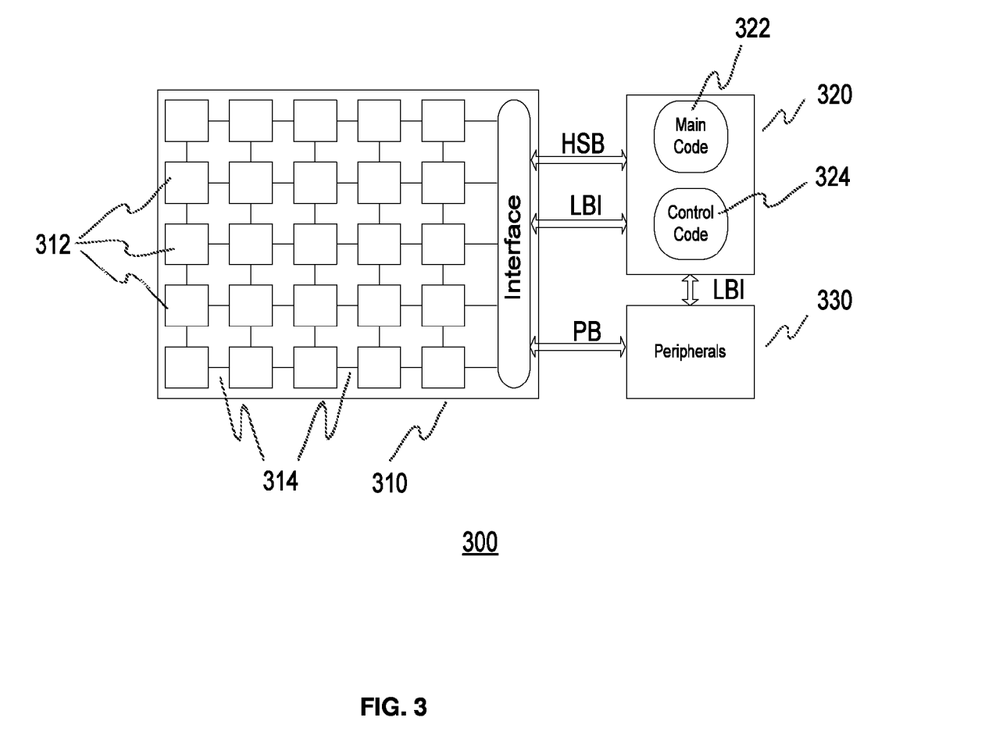
FIG. 3 illustrates a schematic diagram of an exemplary heterogeneous computing system according to an embodiment of the present invention.

FIG. 2 is a flow diagram of a method of developing an application for deployment on a computing system comprising an FPGA according to an embodiment of the invention. An exemplary embodiment of such a computing system 300 according to an embodiment of the invention is shown in FIG. 3. Computing system 300 may be a heterogeneous computing system, which may include instruction-set processors and reconfigurable logic resources, either at chip-level, at board-level, or loosely coupled discrete systems. Instruction-set processors may be general-purpose processors, digital signal processors, reconfigurable processors (i.e. processors tightly coupled with FPGAs), or any other suitable devices, or any combination thereof. For simplicity, they are herein referred to as processors. In this embodiment, computing system 300 includes a processor 320 and reconfigurable logic (resources) arranged in one or more arrays such as FPGA 310. Reconfigurable logic resources may be fine-grained or coarse-grained, homogenous or heterogeneous, and may include one or more field programmable gate arrays (FPGA), one or more of any other suitable reconfigurable logic device, or any combination thereof. For simplicity of description, reconfigurable logic resources are hereinafter referred to as FPGAs. FPGA 310 may include configurable logic blocks, or execution units, which are herein referred to as ultra-simple cores such as USCs 312.

In the embodiments as shown in FIGS. 2 and 3, C++ may be used for developing an application, but any other suitable high-level programming language may also be used. The application may be configured to execute at least partially on FPGA 310. In this embodiment, the application may be configured to partially execute on processor 320, and partially execute on FPGA 310. To develop an application, user-defined application code (e.g. C++ application code 210) is first entered to program the processor 320 with hardware-neutral instructions. The instructions are hardware-neutral in the sense that the application developer does not need to take into account hardware language or hardware configurations and defines instructions in C++ as algorithmic representations of an application. Such algorithmic representations may be at least in part for circuit implementation on FGPA 310. In this embodiment, the developed application, in the form of C++ application code 210, is deployed partially on processor 320 and partially on FPGA 310. The part of the application configured to execute on FPGA 310 may be a computationally intensive part of an application, especially such as those that expose a great degree of data parallelism. Examples of such potentially suitable applications may include pattern matching, video streaming, distributed arithmetic, adaptive control, cryptography and software defined radios, for computationally intensive operations such as heavy bit manipulation, adding, multiplication, comparison, convolution or transformation, for example.

In the embodiment as shown in FIGS. 2 and 3, a software developer creates algorithmic representations of an application (e.g. C++ application code 210) with the aid of one or more libraries compatible with the high-level programming language of interest (e.g. ILS C++ libraries 212). Exemplary ILS C++ libraries 212 may include predefined classes and functions, which may include instructions for configuring FPGA 310 and for interfacing between processor 320 and FPGA 310. At compilation, a compiler (e.g. C++ compiler 214) combines the instructions from C++ application code 210 with the instructions from ILS C++ libraries 212 to generate an executable code (e.g. main code module 322). The execution process may include the programmatic construction of a generic data graph, expressed as streams of records flowing between operators. The data graph is generic in the sense that the data graph doesn't reflect the reconfigurable hardware architecture configuration (i.e. the number and type of USCs configured on the FPGA, as well as the manner in which they are interconnected). The precise manner of the construction of the generic data graph is described in detail further below. In this embodiment, the generic data graph may represent the application to be mapped at least partially onto exemplary USCs 312 of FPGA 310. In other embodiments, the generic data graph may represent the application for deployment partially on FPGA 310 and partially on processor 320. Main code module 322 is included in a user application module 216 and may be linked to a control code module 324. To facilitate the process from ILS application development to deployment, an embodiment of the invention provides ILS runtime libraries 220 that may include algorithms accessible by control code module 324 to map the generic data graph onto FPGA 310 and to configure USCs 312 accordingly. The embodiment of the invention further provides one or more configuration files (e.g. bit files 222) that correspond to various commercially available FPGA platforms, such as Virtex and Spartan FPGA series manufactured by Xilinx™ for example. The mapping of the generic data graph to the FPGA is completed by 1) selecting one or more of the bit files 222 that contains enough reconfigurable logic resources to carry out configuration of the developed application on USCs 312 of FPGA 310, and 2) employing algorithms from ILS runtime libraries 220 to map and configure FPGA 310 according to the generic data graph and the selected FPGA bit file 222, thereby completing FPGA runtime configuration 218. It is to be understood that FPGA configuration does not have to occur at run-time. In some embodiments, FPGA configuration can be accomplished by selecting one or more appropriate bit files 222 in accordance with the above-prescribed method for loading onto FPGA 310, and resetting FPGA 310 to complete FPGA configuration.

Interface and Services

An embodiment of the invention also provides an interface and services to facilitate an all-software development flow for heterogeneous systems. In one embodiment, the interface is an application program interface (API) library that contains predefined API functions to issue simple and complex instructions to configure an FPGA 310. The API library may optionally be part of the ILS C++ libraries 212 shown in FIG. 2. Services may comprise standardized interfaces to FPGA 310 which may applications rely on such as analog-digital converters (ADC), inter-range instrumentation group time code B (IRIG-B) for time-stamping and synchronization, memories and data links to processor 320, for example. When high-level operations are not available in a native high-level programming language such as C++, an application developer may access such a function through a specialized ILS API. Therefore, when developing applications, the application developer may simply use appropriate API functions to request these services, and may not be further concerned with actual low-level interface details. For example, the high-level main code module 322 may use an API function to fetch time-stamped samples from two ADCs, then use a second API function to align the samples, then use a third API function to decimate, and finally use a fourth API function to store the samples.

In an embodiment, the instructions issued by the pre-defined functions in the API library may contain the following USC configuration information: 1) which operation to perform; 2) where to obtain source operands; 3) where to put the result; and 4) when to perform the operation. When instructions are issued, one or more USCs are instructed, directly or through a control code implemented by an intermediate controller, to perform particular operations according to the aforementioned information. In the embodiment as shown in FIG. 3, main code module 322 issues instructions for configuring USCs 312, and control code module 324 translates and interprets these instructions to configure USCs 312 accordingly. If required by main code module 322, the intermediate controller may appropriately instruct USCs 312 on FPGA 310 specialized in carrying out the operations requested by the instructions to pass or get data from registers or network facilities such that samples are streamed into or out of USCs 312.

To raise programming abstraction level, complex instructions are interpreted as aggregates of simple instructions expressed as a sequence of commonly used operations. The interpretation of instructions depends on the data type (e.g. real or complex-valued; scalar or vector) associated with their operands. Namely, when an instruction is issued, control code module 324, which may be implemented by an intermediate controller (not shown), translates the operations requested in the instructions based on the data type associated with the operators in the generic data graph constructed at compilation. For example, if the instruction is simple, and the data type is real-scalar, then the intermediate controller allocates one of USCs 312 to perform the operation. If the width of the data type is too wide to be accommodated by a single USC, then more than one of USCs 312 may be allocated to perform the operation. If the instruction is simple, and the data type is complex, then more than one of USCs 312 are allocated to perform the operation. Additionally, if the width is too wide for a single USC, then further USCs are allocated to accommodate the bit-width.

In another exemplary embodiment, if the data type is a vector or a matrix, then the intermediate controller serializes the operation by instructing USCs 312 how often to repeat an operation. For example, in a vector-vector real-addition in which the data bit-width fits in one USC, to implement this complex instruction, one of USCs 312 is instructed to repeatedly fetch operands from one memory location or buffer, and write them to a certain register or send them down a certain network resource. The repetition is conducted until all vector elements have been fetched. Another USC is instructed to perform a similar operation for the second operand vector. A third USC is instructed to perform the actual addition for each incoming pair of vector elements and to write the result at another memory location or buffer.

As illustrated, in one embodiment, an application developer may conveniently use the same syntax to define different instructions for manipulating data of arbitrary bit-widths and structures. The interpretation of those instructions is delegated to the control code module 324 implemented by an intermediate controller (not shown) for configuring one or more USCs to perform appropriate operations according to a generic data graph. This effectively abstracts low-level details from high-level implementations thereby speeding up development time. Moreover, instruction translation by control code module 324 is desirably fast because no gate-level synthesis is involved so that the potentially time consuming FPGA build-process is avoided. Another advantage is that resulting latency and throughput may desirably be known shortly after implementation. The application developer may quickly learn achievable processing timing without potentially time consuming timing closure procedures typically incurred in traditional FPGA builds.

System Architecture

FIG. 3 shows a heterogeneous computing system 300 according to an embodiment of the invention. As shown in FIG. 3, computing system 300 includes a processor 320 and a reconfigurable logic resource (e.g. FPGA 310) in communication with processor 320 for configuration thereby. In this embodiment, FPGA 310 and processor 320 are separate chips, but in some embodiments, may be packaged or integrated on one chip. Computing system 300 also includes machine-executable instructions (e.g. main code module 322) which may be stored in processor 320, or alternatively in association with processor 320, such as in a memory. The machine-executable instructions are representative of an application configured to execute at least partially on reconfigurable logic array 310, and may be developed from the method of developing an (ILS) application for deployment on a computing system according to the embodiment of the invention as shown in FIG. 2. In this particular embodiment, the application is configured to execute partially on processor 320 and partially on reconfigurable logic array 310. Computing system 300 may further include a service layer (peripherals 330), which may include one or more of an analog-to-digital converter (ADC), digital-to-analog converter (DAC), general purpose input/output (GPIO), dynamic random access memory (DRAM), and/or static random access memory (SRAM). Computing system 300 further includes a high-speed bus (HSB), a local bus interface (LBI), and a peripheral bus (PB). HSB may be used to transfer data or samples between main code module 322 and USCs 312. The terms data and samples are used interchangeably herein. The LBI may be used to configure UCSs 312, peripherals 330, and on-chip network 314 interconnecting USCs 312. The PB may be used to connect other chips to USCs 312. In one embodiment, not all USCs 312 may have direct access to the buses.

In one embodiment, FPGA 310 further includes one or more configurable logic blocks, or execution units, which are herein referred to as ultra-simple cores (USCs 312). USCs 312 communicate with each other with reconfigurable interconnects (e.g. a mesh-type on-chip network 314). Processor 320 may run main code module 322. In an exemplary embodiment, the execution of main code module 322 proceeds in three phases. First, processor 320 running main code module 322 issues instructions or commands to FPGA 310 to configure USCs 312. As mentioned above, the instructions may desirably include configuration information: 1) which operation to perform; 2) where to obtain source operands; 3) where to put the result; and 4) when to perform the operation. Processor 320 may issue instructions to USCs 312 directly or through an intermediate entity such as a controller (e.g. control code module 324). In this embodiment, control code module 324 may be implemented by an intermediate controller (not shown) to translate the service requests issued by processor 320, and to allocate USCs 312 to perform computations and schedule USC operations. For the purpose of ILS, the invention makes a distinction between FPGA configuration and USC configuration.

FPGA Configuration

In the embodiment as shown in FIG. 3, the composition of FPGA 310 is heterogeneous in the sense that USCs 312 may each differ in functionality. This can be used to limit the usage of certain resources such as multipliers. With heterogeneous composition, however, it is foreseeable that certain compositions may be suitable for one set of applications, but not for others. Therefore, one function of the intermediate controller (control code module 324) is to determine which composition to use. To configure FPGA 310, the controller (control code module 324) selects a pre-existing configuration file (e.g. bit files 222) which contains a certain USC composition suitable for the given application on a particular FPGA platform, and maps it onto FPGA 310. As the application is expressed as a generic data graph with multiple operators with data flow between the operators, a USC composition is suitable for the given application if it contains sufficient number and type of operators (e.g. arithmetic operators) required for carrying out the application executed according to the generic data graph under ILS. The mapping algorithm in control code module 324 may be utilized to decompose the generic data graph and associate each node (operators) and edge (data flow) in the graph to USC 312 operations and on-chip interconnecting networks 314. The mapping function may rely on classical technology-mapping algorithms as known in the art, or a modified greedy algorithm as described below in reference to USC configuration, for example.

The mapping at this step results in the selection of an operation for each of USCs 312 and the determination of all routing information.

USC Configuration

Figure 4:
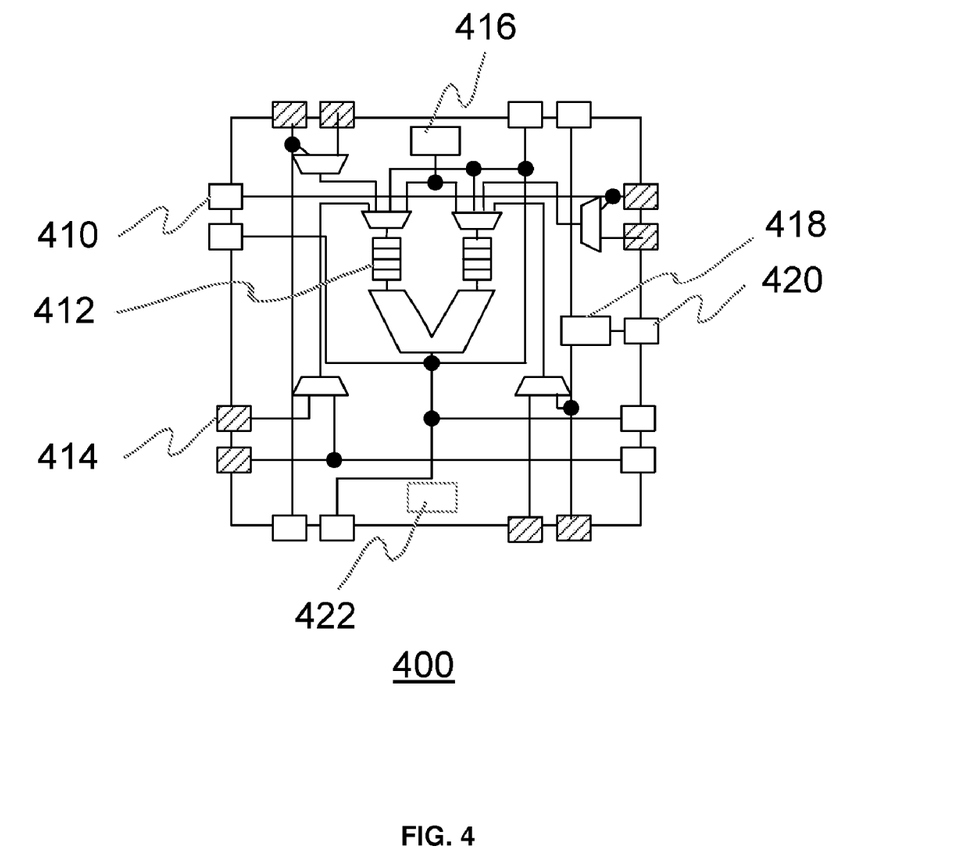
FIG. 4 illustrates a schematic diagram of an exemplary ultra-simple core (USC) architecture according to an embodiment of the present invention.

In one embodiment, after FPGA configuration, USC configuration is performed to construct arbitrary data paths by selecting where each USC 312 should obtain its operands and where to put the results, and specifying when each USC 312 should start its operation. FIG. 4 shows illustration of an exemplary USC architecture according to an embodiment of the invention, such as may be the architecture of USCs 312 in FIG. 3. USC 400 may include an input port 414, an output port 410, an instruction port 420, a clock management circuit 422, a constants memory/register file 416, one or more delay buffers 412, and an instruction/configuration memory 418. To configure the exemplary USC 400, processor 320 may send dedicated instructions or commands through instruction port 420. In one embodiment, these instructions or commands may convey four kinds of configuration information: 1) which operation to perform; 2) where to obtain source operands; 3) where to put the result; and 4) when to perform the operation. The source and destination can be by way of an on-chip network 314, a register file 416, or by way of a shared memory architecture (not shown) as known in the art. The network 314 can be as simple as direct links between USCs, or as complex as packet-based routing networks. This effectively constructs a data path on the FPGA. After FPGA 310 and each of USCs 312 such as exemplary USC 400 are properly configured, samples flow from one USC to another according to the constructed data path, thus processing takes place without direct processor involvement. In this manner, data flows from between USCs which are configured for different operations. Therefore, streaming is taken to the instruction or operator level, hence instruction level streaming is implemented.

Sending of the configuration information to FPGA 310 may rely on addressing, where each USC has a unique geometrical address in the array or grid (on-chip network 314) shown in FIG. 3. For example, in one embodiment, an instruction may select the USC 400 operation, route operands and results through multiplexers, configure delay buffers 412 to align samples or data streams arriving at USC 400 through paths of different lengths, and configure a clock management circuit 422 so that USC 400 operates at a certain clock. Delay buffers, such as delay buffer 412 in USC 400, are used throughout FPGA 310 to ensure that sample streams are aligned prior to operations. Clock management through clock management circuit 422 ensures that multi-rate algorithms can be easily implemented by setting USC clock relative to a global clock rate. In the embodiment as shown in FIGS. 3 and 4, USCs 312 may also each have bypass ports (not shown) to facilitate routing in the mesh-like on-chip network 314.

In a further embodiment, when configuring USCs, placement may desirably be interface aware. For example, if a multiplication operation is to be performed immediately after a sample is obtained from an off-chip memory, then a free USC closest to the off-chip memory may be configured to perform the multiplication operation such that the makespan of the graph on the FPGA is minimized. To place operations close to their sources, a modification of a greedy algorithm may be used. For example, the modification may be based on the allocation problem described in the IEEE Transcations on Computers paper entitled "Heuristics for Flexible CMP Synthesis" by H. Ishebabi and C. Bobda, published October 2009, the section of which entitled "Synthesis Heuristics" is incorporated herein by reference. In the modification as described in the aforementioned IEEE paper, a USC is treated as a processor with zero execution cost. Further, instead of latencies, network communication cost is computed based on distances between processors. The optimization problem is to allocate processors such that the makespan of the graph is minimized. A minimum makespan may therefore automatically result in an optimum processing resource placement.

Example

The below code sequence illustrates part of an exemplary application code 210 developed using C++ according to the embodiment of a method of developing an application for deployment on a computing system of the invention as shown in FIGS. 2 and 3.

```
1    #define ID 0
2    signal sample           (12, 1, ils_real) ;
3    signal demodulated      (16, 1, ils_complex) ;
4    signal ms               (32, 1, ils_real) ;
5    signal sum              (38, 1, ils_real) ;
6    signal last             (32, 1, ils_real) ;
7    signal scaled           (32, 1, ils_real) ;
8    signal decimated        (32, 1, ils_real) ;
9    sample          = ils_adc(0) ;
10   demodulated     = demod (sample) ;
11   ms              = ils_mags (demodulated) ;
12   last            = ils_delay (ms, 64) ;
13   sum             = (ms − last) + sum ;
14   scaled          = ils_extract (sum, 37, 6) ;
15   decimated       = ils_decimate (scaled, 16) ;
16   ils_hsb_out (decimated, ID) ;
17   int rms, ave;
18   while (trule) {
19       ave = ils_hsb_read (ID) ;
20       rms = sqrt (ave) ;
21       // do something with the rms
22       // . . .
23   }
```

The example as shown in the above exemplary application code sequence shows the computation of the root mean square (RMS) of a signal. The RMS computation may be an example of an application kernel. The RMS of a complex-valued signal may be mathematically expressed as:

$$RMS = \text{sqrt}(1/N \Sigma_N (I^2 + Q^2))$$

The exemplary code above shows how HW/SW partitioning may be done, where part of the RMS computation (signal sampling, demodulation and averaging) is configured for execution on an FPGA 310, and part of the RMS computation (square root) is configured for execution on processor 320. At run time, a continuous stream of samples is transferred from FPGA 310 into main code module 322 residing on processor 320 after decimating the output of a moving average.

In the above exemplary application code sequence, to perform RMS computation on a real-valued signal, a set of library is used to define signals (carrying samples or data). Once signals have been defined, they are manipulated or processed under the ILS data processing model. To manipulate the signals under the ILS data processing model, an application developer can use overloaded operators in object oriented programming to issue ILS instructions for manipulating the signals, or use API functions provided in an exemplary ILS C++ library 212 for manipulation. In this embodiment, operator overloading is used. Issuing ILS instructions for the manipulation of signals may desirably not require any special syntax or compiler. ILS operations are desirably inferred from the data type signal: overloaded operators are thereby implemented such that appropriate configuration information is sent to control code module 324.

Still referring to the above exemplary application code sequence, lines 2-8 declare variables to carry samples between USCs 312, and between USCs 312 and peripherals 330. Here, a set of library (e.g. ILS C++ library 212) including predefined classes may be used to define signals for ILS. Here, signal is a C++ class which specifies the bit-width, the dimension and whether or not the signal is complex-valued. The dimension specifies whether a signal is a scalar, a vector, or a matrix.

High-level operations such as decimation which may not be available in native C++ language may be accessible through a specialized API function such as from ILS C++ library 212. The API functions may also be used to request services from peripherals 330 in the service layer. Line 9 shows how samples are read into FPGA 310 from an ADC which forms part of peripherals 330 in the service layer. Samples are then passed into a user-written function for demodulation. In this example, the user function contains code to configure USCs for demodulation (omitted here for brevity). The assignment of overloaded operators for the class type signal infers connections between USCs 312, or between USCs 312 and operators.

Lines 11 and 12 demonstrate the usage of API functions to compute the magnitude-squared of a sample, and to feed samples through a delay line. Similarly, line 13 demonstrates how bits can be extracted, effectively implementing a division operation. These conclude the FPGA-part of RMS computation.

In lines 15 and 16, samples are decimated and sent to processor 320 for further processing via the HSB. Line 17 declares conventional variables to use in the main code module 320. Then in the loop, samples are continuously read from the HSB, followed by square-root computation and further analysis.

Note that, in contrast to line 16, the code in line 19 must be repeatedly called. The reason is that the former is the ILS configuration code for USC 312, whereas the latter is sequential code running on processor 320.

To facilitate verification in the absence of hardware, C++ application code 210 can also be compiled for simulations. In one embodiment, SystemC may be used to simulate hardware behavior. Moreover, as shown in the exemplary code sequence, C++ application code 210 is desirably portable to any compliant hardware platform without changes. Further, the generated user application module 216 is portable to any compliant hardware platform without prior knowledge on the type of FPGA 300 available on the platform. This may desirably decouple application development from platform considerations.

Referring again to the exemplary application code sequence above, the precise nature of how ILS instructions are issued using operator overloading is described. This section describes one exemplary approach of how issuing may be accomplished through operator overloading. A person of ordinary skill in the art can appreciate that other programming styles and implementations may proceed differently to issue ILS instructions through operator overloading. Moreover, a person of ordinary skill in the art would appreciate that, in the manner described below, the exemplary control code is comprised of overloaded operators. This means that, when the application developer enters C++ application code 210, the user directly composes main code module 322, and indirectly changes control code module 324.

As an example, line 13 of the exemplary code sequence shows the user code describing a subtraction between signals ms and last. The class signal overloads the operator + to do the following steps:

1. Based on parameters of the signal associated with the operation, the overloaded operators residing in control code 220 will determine the number and types of operators needed to perform the operation. In the example, both ms and last are scalar real-valued 32-bit signals; therefore, one 32-bit subtractor is allocated to perform the sum operation at line 13.

2. The class signal has a static member variable graph (omitted here for brevity). The graph describes the structure of the data path as described by C++ application code 210. In the foregoing example, graph describes the structure for computing the RMS. The class also contains a static member function to construct and manipulate the graph object. Then, in a second sub-step, the overloaded operator calls the member function to add to the graph the 32-bit subtractor determined in step 1.

In the exemplary code sequence, the construction of the graph ends at line 15. At this point, the structure of the graph is generic, and doesn't yet reflect the hardware architecture configuration (i.e. the number and type of USCs on the FPGA, as well as the manner in which they are interconnected). At line 16, the call to initiate data transfer to the main code also calls a static member function belonging to the class signal to map the graph. The mapping proceeds as follows: First, there exists several bitfiles which correspond to different reconfigurable hardware architecture (such as FPGAs) configurations. In the first step, the mapping function selects a suitable bitfile to load to the FPGA. The selection is based on the number of resources required to implement the data path. In the foregoing example, any suitable bitfile specifying a suitable configuration containing enough resources for two (2) 12-bit multipliers (for line 10), 2 16-bit multipliers (for line 11), 1 32-bit adder (for line 11), 1 32-bit adder (for line 13) and 1 32-bit subtractor (for line 13) will be selected.

In this particular example, the mapping function may then use classical technology-mapping algorithms to decompose the graph and associate each node and edge in the graph to USC operations and on-chip networks. At this step, an operation for each USC 312 has been selected, and all routing information has been determined.

Then, for each USC 312, the mapping function sends configuration information through the local bus interface (LBI) as exemplified in FIG. 3. Sending of this information may rely on classical geometrical addressing schemes. Each USC "sees" configuration information at its instruction port 420 as exemplified in FIG. 4, determines if the information is meant for it, and takes appropriate actions to store the configuration in its internal memory.

Once mapping is completed, the actual data transfer is initiated. Transferring data to and from the FPGA 310 may use known packet schemes as known in the art, for example.

Accordingly, as shown, by presenting a novel instruction level streaming (ILS) data processing model in a high-level programming language that expresses an application as operators with data flow therebetween, the method and computing system of embodiments of the present invention integrate traditional software and hardware design flows, support run-time FPGA reconfiguration, provide design portability, bypass traditional logic synthesis and overheads associated with instruction scheduling and explicit data movement instructions.

The exemplary embodiments herein described are not intended to be exhaustive or to limit the scope of the invention to the precise forms disclosed. They are chosen and described to explain the principles of the invention and its application and practical use to allow others skilled in the art to comprehend its teachings.

As will be apparent to those skilled in the art in light of the foregoing disclosure, many alterations and modifications are possible in the practice of this invention without departing from the spirit or scope thereof. Accordingly, the scope of the invention is to be construed in accordance with the substance defined by the following claims.

What is claimed is:

1. A method of developing, without need for synthesis, an application for deployment on a computing system, the computing system comprising a processor and a reconfigurable logic in communication with the processor for configuration thereby, the method comprising:
    programming the processor with hardware-neutral instructions in a high-level software programming language, the instructions representative of an application configured to execute at least partially on the reconfigurable logic;
    instantiating elements required for the application from a library of elements compatible with the high-level programming language; and
    constructing programmatically a generic data graph representative of the application to be mapped at least partially onto the reconfigurable logic, the generic data graph being expressed as streams of records flowing between operators.

2. The method of developing an application for deployment on a computing system according to claim 1 further comprising mapping the generic data graph to the reconfigurable logic.

3. The method of developing an application for deployment on a computing system according to claim 1, wherein the reconfigurable logic comprises reconfigurable logic blocks arranged in an array, the method further comprising:
    selecting a configuration file to load to the reconfigurable logic array based on resources required to implement a generic data path, thereby configuring the reconfigurable logic array; and
    selecting an operation for each of the reconfigurable logic blocks and determining routing information for data therebetween,
    thereby configuring the reconfigurable logic blocks.

4. The method of developing an application for deployment on a computing system according to claim 1, wherein the generic data graph is constructed programmatically with operator overloading.

5. The method of developing an application for deployment on a computing system according to claim 1, wherein the generic data graph is constructed programmatically with library functions.

6. The method of developing an application for deployment on a computing system according to claim 1 further comprising generating a machine-executable code in response to the programmed instructions and the instantiated library elements.

7. The method of developing an application for deployment on a computing system according to claim 1, wherein the application is configured to execute partially on the reconfigurable logic and partially on the processor.

8. The method of developing an application for deployment on a computing system according to claim 1, wherein the application is configured to execute on the reconfigurable logic.

9. A computing system, comprising:
    a processor;
    a reconfigurable logic in communication with the processor for configuration thereby without need for synthesis; and
    machine-executable instructions representative of an application, the application configured to execute at least partially on the reconfigurable logic, at least the portion of the application configured to execute on the reconfigurable logic being represented by a generic data graph constructed from a high-level programming language, the generic data graph being expressed as streams of records flowing between operators;

wherein the processor configures the reconfigurable logic based at least in part on the machine-executable instructions and the generic data graph.

10. The computing system according to claim 9, wherein once the reconfigurable logic is configured by the processor, the application configured to execute at least partially on the reconfigurable logic is executed independently of the processor.

11. The computing system according to claim 10, wherein the application configured to execute at least partially on the reconfigurable logic is executed independently of instruction scheduling.

12. The computing system according to claim 10, wherein the application configured to execute at least partially on the reconfigurable logic is executed without explicit data movement instructions.

13. The computing system according to claim 9, wherein the reconfigurable logic comprises reconfigurable logic blocks arranged in an array, and wherein the processor configures the reconfigurable logic array by:

selecting a configuration file to load to the reconfigurable logic array based on resources required to implement a generic data path, thereby configuring the reconfigurable logic array; and selecting an operation for each of the reconfigurable logic blocks and determining routing information for data therebetween, thereby configuring the reconfigurable logic blocks.

14. The computing system according to claim 9, wherein the generic data graph is constructed programmatically with operator overloading.

15. The computing system according to claim 9, wherein the generic data graph is constructed programmatically with library functions.

16. The computing system according to claim 9, wherein the application is configured to execute partially on the reconfigurable logic and partially on the processor.

17. The computing system according to claim 9, wherein the application is configured to execute on the reconfigurable logic.

* * * * *